US006219732B1

(12) United States Patent
Henrie et al.

(10) Patent No.: US 6,219,732 B1
(45) Date of Patent: *Apr. 17, 2001

(54) APPARATUS AND METHOD FOR WIRELESS COMMUNICATION BETWEEN A HOST AND A SELECTIVELY REMOVABLE MODULE ELECTRICALLY CONNECTED TO THE HOST

(75) Inventors: James Henrie, Grayslake, IL (US); John Evans, Riverton; Minh Truong, Sandy, both of UT (US)

(73) Assignee: 3Com Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/782,046

(22) Filed: Jan. 10, 1997

(51) Int. Cl.[7] .................................................. G06F 13/00
(52) U.S. Cl. ............................................................ 710/102
(58) Field of Search .................................. 395/281, 282, 395/283; 710/101, 102, 103; 235/487

(56) References Cited

U.S. PATENT DOCUMENTS

| 5,189,287 | 2/1993 | Parienti | 235/375 |
| 5,206,495 | * 4/1993 | Kreft | 235/492 |

(List continued on next page.)

FOREIGN PATENT DOCUMENTS

| 1 584 901 | 2/1978 | (CH) | A61B/5/02 |
| 2 244 617 | 4/1991 | (GB) | H03J/5/00 |
| 6-231060 | 8/1994 | (JP) | |
| WO 95/29481 | 11/1995 | (WO) | G10L/7/08 |

OTHER PUBLICATIONS

Using PCMCIA as a Barcode Data Capture Device, *Research Disclosure*, P.443–445, Jun. 1995.

Primary Examiner—Glenn A. Auve
(74) Attorney, Agent, or Firm—Workman, Nydegger & Seeley

(57) ABSTRACT

A selectively removable module, such as a PCMCIA card, inserted into a host computer system, such as a notebook computer, is provided that has a electrical interface between the module circuitry and the host computer circuitry, A wireless data channel is implemented between the module circuitry and the host computer system circuitry that is independent of the electrical interface. This wireless communications channel is implemented entirely within the confines of the external housing of the host computing system. One embodiment uses an infrared LED or emitter to transmit infrared signals from the module circuitry to an infrared sensitive phototransistor located within the host and electrically connected to the host circuitry. Likewise, an infrared LED or emitter located within the host computer housing and electrically connected to the host computer circuitry transmits an infrared signal to a infrared sensitive phototransistor located on the module and electrically connected to the module circuitry to complete a bi-directional, wireless data transmission channel. The internal wireless data transmission channel allows large data throughput without interfering with the operation or capacity of the normal electromechanical interface between the module circuitry and the host computer system. Such a wireless data communications channel finds particular use in implementing a speakerphone on a host computer system, such as a notebook computer, having a microphone and speaker but using the circuitry in a PCMCIA modem card to manage and control the speakerphone.

8 Claims, 11 Drawing Sheets

U.S. PATENT DOCUMENTS

| | | | |
|---|---|---|---|
| 5,296,641 | 3/1994 | Stelzel | 84/602 |
| 5,336,099 | 8/1994 | Aldous et al. | 439/131 |
| 5,343,319 * | 8/1994 | Moore | 359/152 |
| 5,423,697 | 6/1995 | MacGregor | 439/638 |
| 5,438,210 | 8/1995 | Worley | 257/82 |
| 5,440,449 | 8/1995 | Scheer | 361/686 |
| 5,445,525 | 8/1995 | Broadbent et al. | 439/64 |
| 5,446,783 | 8/1995 | May | 379/59 |
| 5,451,933 | 9/1995 | Stricklin et al. | 340/825 |
| 5,457,601 | 10/1995 | Georgopulos et al. | 361/686 |
| 5,594,233 * | 1/1997 | Kenneth et al. | 235/492 |
| 5,594,680 * | 1/1997 | Ohtake et al. | 365/63 |
| 5,649,224 * | 7/1997 | Scheer | 395/309 |
| 5,698,837 * | 12/1997 | Furatu | 235/492 |
| 5,736,727 * | 4/1998 | Nakata et al. | 235/487 |
| 5,736,782 * | 4/1998 | Schairer | 257/679 |
| 5,999,713 * | 12/1999 | Reiner et al. | 710/102 |

* cited by examiner

APPARATUS AND METHOD FOR WIRELESS COMMUNICATION BETWEEN A HOST AND A SELECTIVELY REMOVABLE MODULE ELECTRICALLY CONNECTED TO THE HOST

BACKGROUND OF THE INVENTION

1. The Field of the Invention

The field of the invention relates to the extensibility of standardized electrical interconnection schemes such as the PCMCIA interface. The invention also relates to communication systems between a host system and a selectively removable module, such as a PCMCIA card, the communication system operating while the card is electrically connected to the host system. More particularly, the invention relates to infrared communication systems for communicating between entities sharing the same power supply or that are otherwise electrically connected.

2. Present State of the Art

In many instances, host systems, such as computer systems, provide a form of extensibility through the use of modular additions that are typically electrically connected with the host system when added. An example of such modular additions are specialized cards that fit into a PC mother board or PCMCIA cards that fit into a notebook computer PCMCIA receptacle. Such cards are electrically connected to the host system according to a defined interface and typically derive power from the host system in order to operate the circuitry contained therein. The electrical connection further allows communication of data and control information between the two entities.

The defined interface is composed of physical dimensions such as card size, type of electrical contacts, number of electrical contacts, etc. and operating characteristics, such as signals presented on each contact, timing of signals, and/or scheme of operation. Such standardization allows manufacturers other than the host system manufacturer to create the extensible modules for interacting with the host system. Throughout this application, reference will be made to the PCMCIA standard as a representative example and not by way of limitation. The concepts illustrated in connection with the present invention as used with a PCMCIA card can be applied to any standardized interface.

While standards have the advantage of allowing others to successfully interface with the host system, they have limitations that may hamper a card designer. The standards define the number and meaning of electrical connections between the host system and the card and there may be conflict with the objectives of the card designer in accessing facilities found on circuitry within the host system. A standard typically sacrifices some flexibility in order to have the predictability that allows all who design to the standard the ability to interact with the host system. Card designers are sometimes limited in their options since designing to the standard is necessary in order to have a ready market for the card because host system manufacturers will typically support only one or two standards.

Using the PCMCIA standard as a representative example, some of the limitations of a standard will be shown. The PCMCIA standard has defined digital signals (e.g., binary data) and control signals in order to transfer digital information between card and host. The PCMCIA standard does not have facility for analog signals a significant limitation depending on the functionality of a given PCMCIA card.

A representative example throughout this application is that of a speakerphone incorporated on a PCMCIA modem card using a host system microphone and speaker as part of its implementation. Because of such an arrangement, the PCMCIA card requires the analog signal to pass from the microphone to the PCMCIA card and for control thereon before being communicated through the telephone line connector found on the PCMCIA card. Likewise, analog signals will need to be communicated from the PCMCIA modem card to the speaker located on the host system. There needs to be some way to communicate this analog signal between the host system and the PCMCIA card. This particular representative example and the implementation thereof along with the present invention will be shown in more detail hereafter.

Other situations where the host system needs to communicate with the selectively removable card or module in a manner beyond that of the predefined interface include modem DAA cards, data acquisition systems, etc.

It becomes impractical to simply change the standardized interface or omit it altogether in lieu of a custom-designed interface due to the acceptance of standards by host system designers Typically, a host system manufacturer will include one or perhaps two defined interfaces for the interconnection of cards or other extensible modules and if they are not chosen by component manufacturer, there will not be a ready market for the card. It is economically infeasible to attempt to persuade all manufacturers to adopt a custom interface when standards exist that allow most functionality to be implemented therein. It is naturally more desirable to simply extend the existing standard in some fashion in order to accomplish the particular purposes of a selectively removable card or module designer.

Others have attempted to address this extensibility issue and extend a given interface by multiplexing the interface signals, adding additional mechanical and electrical connection arrangements, or by using an external connection between the selectively removable card or module and another connection or interface found and available by the host system through an external cable connecting the two devices. Each of these potential solutions suffer serious detrimental characteristics that lead to a continual search for a better solution.

Multiplexing the signals found on a standardized connection such as the PCMCIA interface uses the same physical or mechanical connection and simply shares the signal band width between the PCMCIA standard protocol and the extension provided by the selectively removable card designer in order to accomplish the desired task. For example, in the representative example of a speakerphone implemented on a modem PCMCIA card, analog voice signals would be mixed with the PCMCIA digital signals in order to transfer voice signals to and from a PCMCIA card (and phone line) and the host system microphone and speaker. The drawbacks encountered include an overburdening of the signals carried on the respective PCMCIA contacts that leads to errors, inefficient operation, and sometimes a performance degradation. Additionally, conflicts may occur with the PCMCIA architecture such that normal communications between the card and the host are sometimes interrupted. Finally, the amount of data communicated between card and host may be insufficient for an application because of the reduction in available band width due to sharing the signals.

Another method of extending the capabilities of an interface is through the use of additional mechanical electrical connections. For example, a side pin can be mounted on the frame of a PCMCIA card for interaction with the corresponding receptacle found within the card guide mounted on the host or other location. Other variations include forms of spring contacts to engage to two metal components, one located on the card frame and the other located on the card guide or otherwise mounted at the host. Such electromechanical connections have been found in many instances to lack solid contact and therefore are less reliable. Furthermore, they are susceptible to increases wear during normal operation because of the location of the electromechanical location. Finally, such a sidepin connection can be very expensive due to the extensive modifications made to the card frame and to the card guide adding additional components.

Many host systems have a variety of different interfaces in order to meet the demands of different communication devices. For example, a PC will have in many instances a sound card having a line out connection or a line in connection in order to handle specifically analog voice signals. A final method of extending the capabilities of a given interface uses external cables to connect the analog data input or output from a sound card to an external connection on the PCMCIA card itself. In this manner, the voice data can be communicated through this external cable and causing no interference with the normal PCMCIA connection. Such an external cable and connector arrangement is cumbersome and unwieldy and requires more physical componentry on the card which in turn increases manufacturing complexity and expense. Furthermore, the external cable or cables are ever present and add to overall desktop clutter. Since a PCMCIA card is used in many instances for use with a portable notebook computer that is set up and taken down often, the additional time and effort for connecting yet another cable is bothersome.

In conclusion, there exists a need for a way of communicating to a selectively removable card that is connected to a host system through a standardized interface that does not use the standardized interface but is also inexpensive, reliable, and convenient for the user of the system and selectively removable card. Though attempts have been made to remedy this problem and allow such communication between host and selectively removable modular card, the drawbacks can be so undesirable as to prohibit actual implementation because of added expense, complexity, and unreliability.

SUMMARY AND OBJECTS OF THE INVENTION

It is, therefore, an object of the present invention to allow wireless communication between a host and a selectively removable card electrically connected to the host without utilizing any hardware external to the host housing.

It is another object of the present invention to allow wireless communication between a host and a selectively removable card or module electrically connected to the host without extra electromechanical connections and without multiplexing signals on a standardized interface.

It is yet another object of the present invention to allow wireless communication completely within a host system housing between a host and a selectively removable card or module.

It is a further object of the present invention to extend the data pull capabilities between a selectively removable card or module and a host-system and overcome the limitations of a standardized interface electrically connecting the card or module to the host system.

Additional objects and advantages of the invention will be set forth in the description which follows, and in part will be obvious from the description, or may be learned by the practice of the invention. The objects and advantages of the invention maybe realized and obtained by means of the instruments and combinations particularly pointed out in the appended claims.

To achieve the foregoing objects, and in accordance with the invention as embodied and broadly described herein an apparatus and method for wireless communication between a host and a selectively removable card electrically connected to the host is presented.

The present invention incorporates a wireless communications channel between a host system and a selectively removable card electrically connected within the host system The host system and the selectively removable card will share the same power supply to power the circuitry found on each but will communicate at least a portion of the data between them through the wireless communications channel. They may also, and in fact typically do, communicate information through a standardized connection, such as a PCMCIA interface that provides connection between them.

In many instances, the wireless communications channel is used to overcome limitations in such a standardized interface. For example, the PCMCIA interface defines all of the pin or contact connections thereby making it impossible for a designer to add additional signals to be communicated between the host system and a PCMCIA card. Further, there is no requirement that there be a standardized interface only that the selectively removable card or module is electrically connected and at least receives power through that electrical connection.

One exemplary embodiment of the present invention extends the PCMCIA interface so that analog voice data can be communicated between a selectively removable PCMCIA card and a host (typically a notebook computer) that has a speaker and a microphone contained therein. One application of such an exemplary embodiment is to create a speakerphone with the PCMCIA card providing the interconnection to a standard phone jack. If the selectively removable PCMCIA card can receive and transmit analog voice signals, then the card may be configured to act as a speakerphone. This is a particularly beneficial extension to a PCMCIA card already configured to be a data modem that are currently prevalent and popular with owners of notebook computers.

A wireless communications channel comprises a first and second wireless signal transfer means thereby making up a bi-directional data channel. One wireless signal transfer means resides on the PCMCIA card while the other wireless signal transfer means resides on the host and the two are so oriented that communications can occur between them. For example, an infrared emitting LED and a photo transistor to receive and respond to infrared emissions can comprise each of the two signal transfer means and would be so oriented that the infrared light emitted from the IR LED may easily reach the corresponding photo transistor.

While the exemplary embodiment shows a bi-directional communications channel, the present invention could be embodied as a unidirectional channel between either the host to the selectively removable card or between the selectively removable card and the host. Such unidirectional implementations would be considered within the scope of the present invention.

In a PCMCIA implementation as disclosed in the exemplary embodiment, the infrared LED or emitter and photo transistor for the PCMCIA card can be positioned to transmit and receive through the top or bottom cover portion of the jacket of the PCMCIA card or through the side or frame area of the PCMCIA card. To allow transmission through the PCMCIA card jacket, two common techniques are employed. First, a smokey gray plastic similar to that found in consumer electronic remote controls can be used to cover the area where the IR LED and photo transistor are located such as the covers or side frames. This is particularly convenient for side transmission of the signal transfer means since they can be simply mounted on the PCMCIA card circuit board with no additional hardware or mechanical additions that will in turn minimize the manufacturing cost of the present invention. Another method is to bore appropriately sized holes to allow the infrared emissions to occur through the PCMCIA card, this typically occurring in the jacket or the side chassis. In general, any form of packaging that allows the infrared light to pass can be utilized.

Naturally, other forms of wireless transmission and reception can be used to implement the present invention. For example radio frequency or ultrasonic frequency devices could be used in place of infrared LEDs and corresponding photo transistors.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawing depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

As used herein, the term "wireless signal transfer means" refers to any known method and/or apparatus for transmitting and receiving analog or digital signals from one point to another point. The medium for transmitting the signals may be light waves, including infrared light, radio waves, ultrasonic waves, or any other waves along the electromagnetic spectrum. For purposes of the illustrative and exemplary embodiments, infrared LEDs to transmit a signal and phototransistors that are sensitive to infrared light to receive the signal are shown as an example of a wireless signal transfer means. This form of wireless signal transfer means is shown by way of example and not by limitation and those skilled in the art will undoubtedly understand and appreciate various different ways of transmitting a signal without the use of wires or other physical implements between two points.

As used herein, the term "selectively removable module" refers to a component that is optional to the normal functioning of a host computer system. Such a module will receive power from the host system to power its internal circuitry and may optionally communicate with the host through an electromechanical interface to transmit and receive data and control information. Shown by way of example and not by limitation throughout this application is a selectively removable module in the form of a PCMCIA component card that communicates through the PCMCIA interface. Other examples of selectively removable modules include but are not limited to standard computer add-in cards such as sound cards, data acquisition cards, modems, video cards, etc. but would also include chips and other modules that connect directly to a computer mother board, other add-in components such as SIMMs used for memory, etc.

Figure 1:
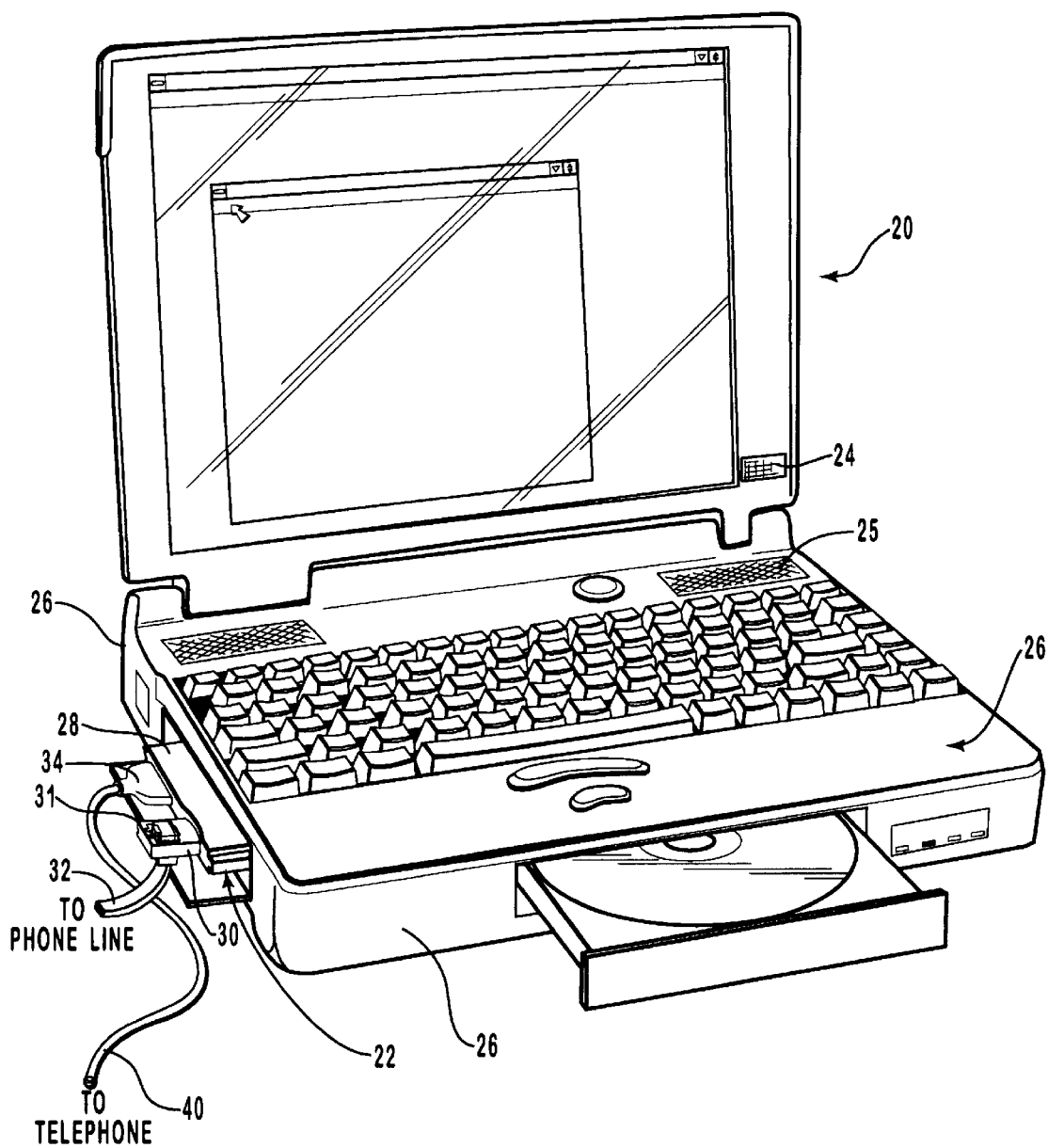
FIG. 1 is a perspective drawing of a notebook computer having a PCMCIA card inserted therein that is connected both to a telephone and a phone line for use in a unique speakerphone application illustrating the present invention.

FIG. 1 shows a notebook computer 20 having a PCMCIA card 22 inserted therein, the PCMCIA card 22 and notebook computer 20 cooperating to form a speakerphone. The notebook computer 20 has a microphone 24 and a speaker 25 that will be used in implementing the speakerphone according to the present invention. Notebook 20 also has an external housing 26 that encompasses and encloses all the internal computer circuitry. The PCMCIA card 22 acts as a selectively removable module that can be inserted and electronically coupled with the internal computer circuitry of the notebook computer 20. The PCMCIA card 22 has an external jacket that encompasses and encloses its internal circuitry with at least a portion thereof contained within the external housing 26 of the notebook computer 20.

The PCMCIA card 22 also has a RJ11 jack 30 extending therefrom that has a phone cord 32 connected thereto by RJ11 plug 31 that will electrically connect the PCMCIA card internal circuitry to a phone line. Also, the PCMCIA card 22 connects to a special IO connector 34 that is connected to a telephone by phone line 40. An off-hook detect mechanism is found within the IO connector 34 and comprises internal circuitry to determine when a telephone is in the off-hook state so that this status can be communicated to the PCMCIA card in order to disable the speakerphone. These components are necessary for interfacing the PCMCIA card 22 controlling the speakerphone with the phone network through phone line 32 and with a standard telephone through phone line 40.

The internal circuitry of the PCMCIA card 22 in conjunction with the circuitry of the notebook computer 20 will provide a speakerphone application utilizing the available microphone 24 and speaker 25 incorporated into the notebook computer 20. It may be noted that microphone 24 may be replaced by a sound card and externally connected microphone and be functionally equivalent for purposes of this speakerphone application. In like manner, the speaker 25 may be replaced by external speakers connected to a standard sound card. Furthermore, signals are transferred between the PCMCIA card 22 and the notebook computer 20 internal circuitry by way of a wireless signal transfer means thereby implementing the present invention as shown hereafter.

Figure 2:
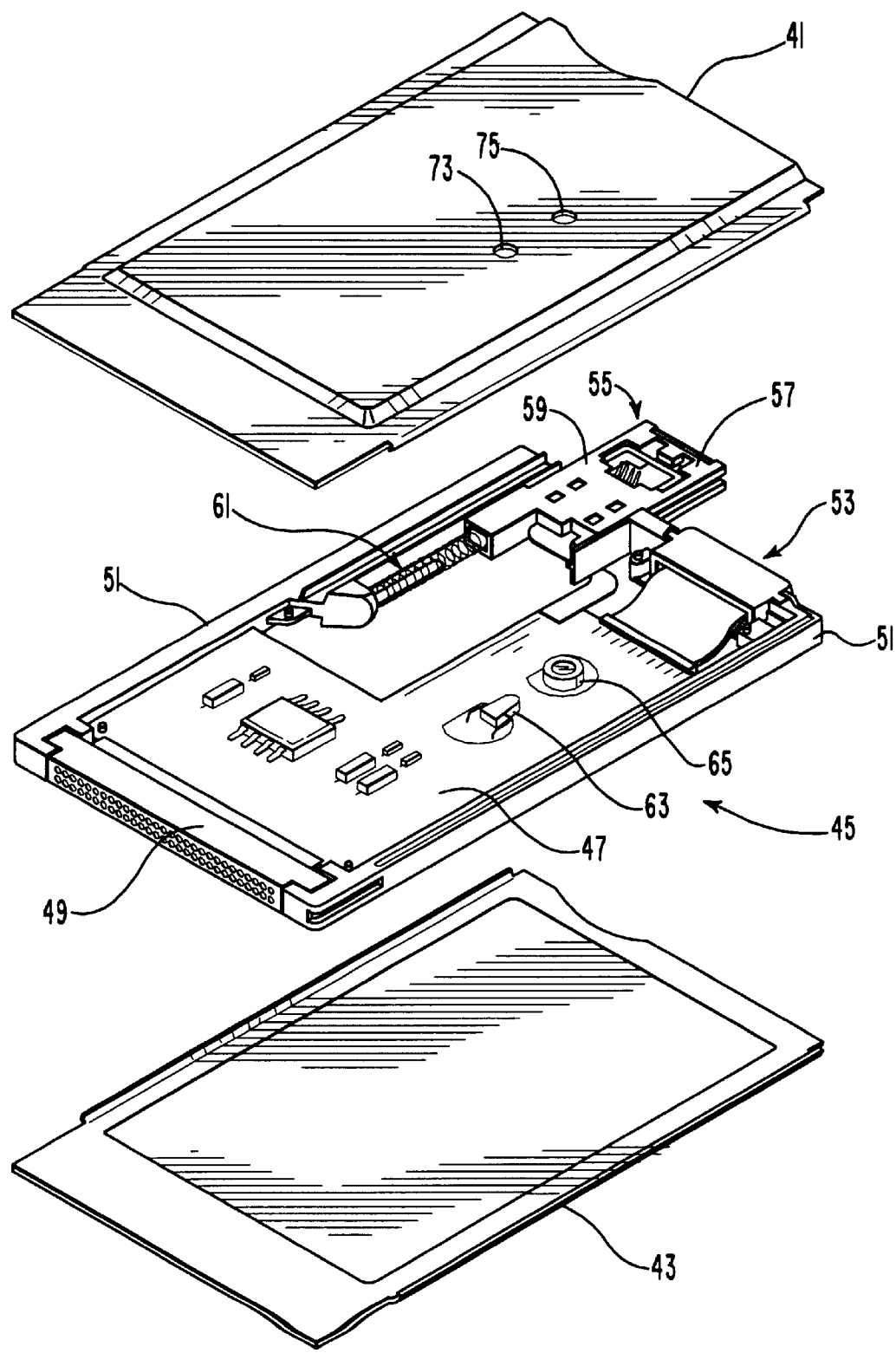
FIG. 2 is an exploded perspective view of a PCMCIA card incorporating one embodiment of the present invention wherein the infrared transmission and reception means operate through orifices in the upper jacket of the PCMCIA card.

FIG. 2 is an exploded perspective drawing of an exemplary embodiment of the present invention as used in the notebook computer 20 of FIG. 1 incorporating the unique communication apparatus of the present invention and for implementing a speakerphone. The PCMCIA modem card comprises an upper jacket piece 41, a lower jacket piece 43, and an internal circuit assembly 45. The upper and lower jacket pieces, 41 and 43, respectively, encompass the internal circuit assembly to form the exterior confines of the card.

The internal circuitry assembly 45 is composed of a circuit board 47 populated with various components interconnected so as to provide modem functionality (or alternatively other functionality). Encircling the circuit board 47, is a supporting frame 51 and a host computer interface 49. The host computer interface 49 is electrically coupled to the circuitry on the circuit board 47 so as to provide an electrical connection to the host computer system, typically a notebook computer. In this example, the host computer interface 49 is configured according to the PCMCIA standard. Furthermore, an IO receptacle 53 and an RJ11 jack assembly 55 are electronically coupled to the circuit board 47.

The RJ11 jack assembly 55 is composed an RJ11 jack 57 fit within a RJ11 jack base 59 that is selectively extensible with respect to the supporting frame 51 by way of a spring mechanism assembly 61. This allows the RJ11 jack to be either extended away from the main body of the PCMCIA card or stored internal to the card. This is useful for allowing the jack to be internally stored when not in use so as to keep all aspects of the PCMCIA card within the external housing of the host computer environment.

Important to the present invention is a phototransistor 63 that is sensitive to infrared light and an infrared LED 65 that emits infrared light. A complementary infrared LED is found on the host computer system in line with the phototransistor 63 and a complementary phototransistor is found on the host system in line with infrared LED 65. Furthermore, the upper jacket piece 41 has orifice 73 and orifice 75 that allow infrared light signals to pass uninhibited. Alternatively, orifices may be contained in the lower jacket piece 43 and the infrared LED 65 and the phototransistor 63 properly placed on the bottom side of the circuit board 47. The upper jacket piece 41 and the lower jacket piece 42 are typically constructed of steel about 0.008 inch in thickness and the orifices are bored into the respective pieces according to embodiment and configuration.

In this manner, signals can be transferred in a wireless manner between the circuitry found on circuit board 47 and the host computer system circuitry without passing through the host computer interface 49. This bi-directional wireless data communication channel overcomes the problems found in the art and provides an advantageous implementation of high band width information communication. This is necessary in a number of applications, and exemplary application being the speakerphone capability implementation into a standard PCMCIA modem as shown hereafter in more detail.

Exemplary phototransistors used in this and other embodiments would be model LPT-80A or model SFH307 phototransistors available from Siemens. Equivalent to phototransistors as used throughout this application would be a photodiode accompanied by a gain circuit as would be known by those skilled in the art. Exemplary infrared emitter or LED would be model IRL 81A or model IRA 81A, again from Siemens.

One of the important characteristics of the above-mentioned models for the phototransistor and the infrared LED is the availability in miniaturized packaging. This allows such components to be used on the relatively small PCMCIA form factor, that is a common standard for use with notebook computers.

Figure 3:
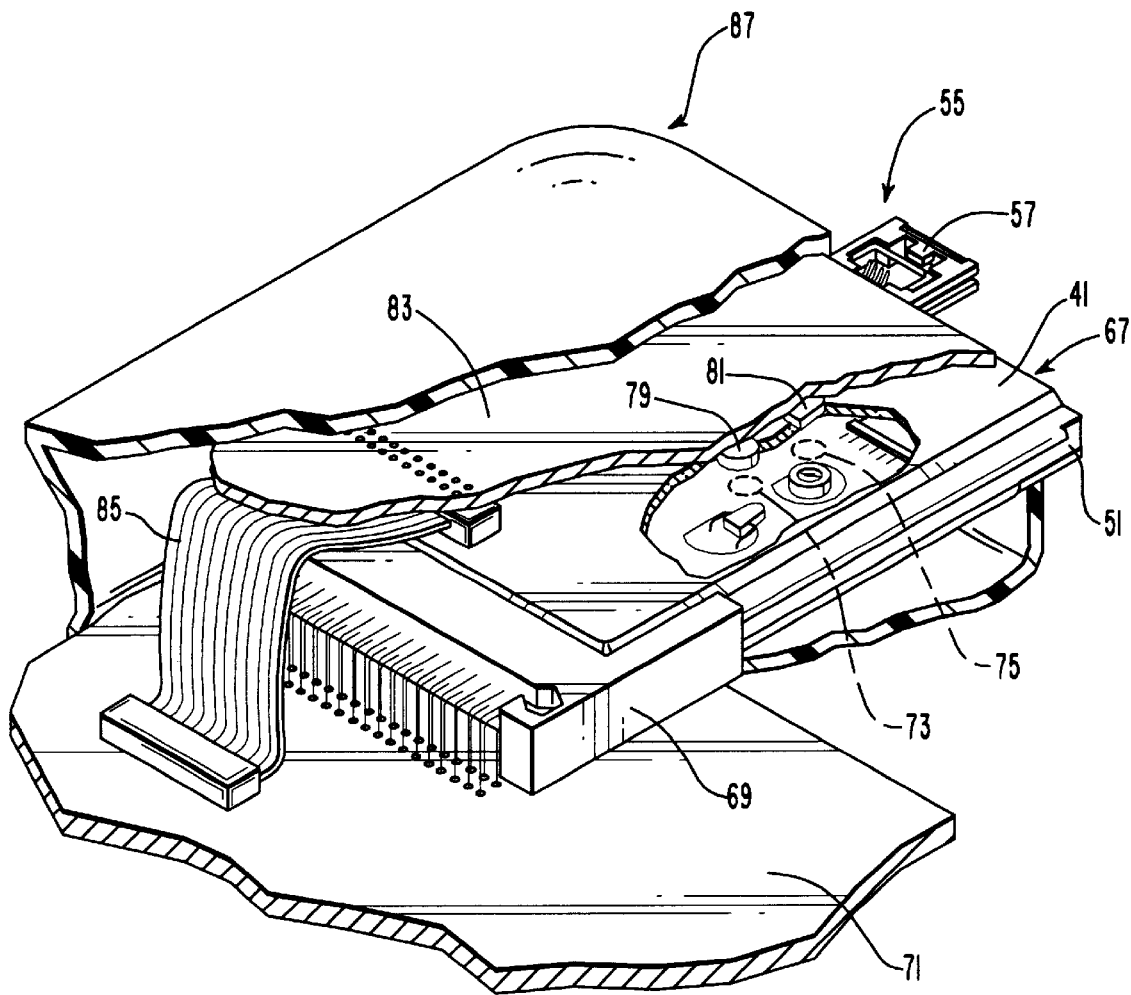
FIG. 3 is a cutaway perspective of a PCMCIA card of FIG. 2 while the card is inserted in its receptacle and showing communication between the card and the host computer.

FIG. 3 is a cutaway view of the PCMCIA card inserted in a notebook computer with the infrared LED and infrared sensitive phototransistor being completely within the confines of the external host computer housing for the embodiment shown in FIG. 2. A PCMCIA modem card 67 is inserted into a PCMCIA receptacle 69 that is electrically coupled to the host computer mother board 71. The PCMCIA modem card 67 also has a RJ11 jack assembly 55 shown in the extended position for interfacing with a phone network.

Once in the inserted position, the infrared sensitive phototransistor 75 and the infrared LED 77 (not shown in FIG. 2) are at a position completely within the external housing 67 of the host computer system. It may be noted that while a notebook computer is shown in this example, that any computer system may be used as the host computer system such as a desk top computer systems, palm top computer systems, video game systems, and a variety of consumer electronics, etc.

Furthermore, an infrared LED 79 and infrared sensitive phototransistor 81 are connected to a base 83 and electronically connected to the host computer system circuit board 71 through connection means 85. Again, the infrared LED 79 and the infrared sensitive transistor 81 that are electrically connected to the host computer system circuit board 71 are again completely enclosed within the host computer system housing 87. Furthermore, when the PCMCIA modem card 67 is in the inserted position, the infrared LED 79 is linearly aligned with the infrared sensitive phototransistor 63 and the infrared sensitive phototransistor 81 is linearly aligned with the infrared LED 65 so as to allow signals to pass between the respective LED-photo-transistor pairs found on the PCMCIA modem card 67 and base 83 to allow bi-directional wireless signal transfer between the PCMCIA modem card 67 and the host computer circuit board 71 through orifices 73 and 75, respectively.

Those skilled in the art will appreciate that there are other ways of allowing the infrared signals between the infrared sensitive photo-transistor 64 and infrared LED 66 on the PCMCIA modem card 68 with the infrared LED 80 and the infrared sensitive photo-transistor 82 located on the base mounting 84 than simply passing through holes drilled therein to allow the infrared signals to pass. For example, infrared transparent materials may be used in PCMCIA card construction as will be shown hereafter in connection with another embodiment. Additionally, those skilled in the art will note that the transmission componentry may be placed anywhere within the PCMCIA modem card 67 so long as they are linearly aligned with corresponding IR componentry electrically connected to the host computer system circuit board 71.

It may be noted that the infrared LED 79 and the infrared sensitive phototransistor 81 may be mounted on the host computer system circuit board 71 with the corresponding infrared sensitive phototransistor 63 and infrared LED 65 mounted on the back side of the PCMCIA modem card 67 circuit board 47 to avoid having a separate base 83 and electrical connection means 85. Naturally, in such a configuration the lower jacket piece 43 of the PCMCIA modem card 67 would have to let infrared light pass uninhibited through holes, transparent material, or in some other manner.

Figure 4:
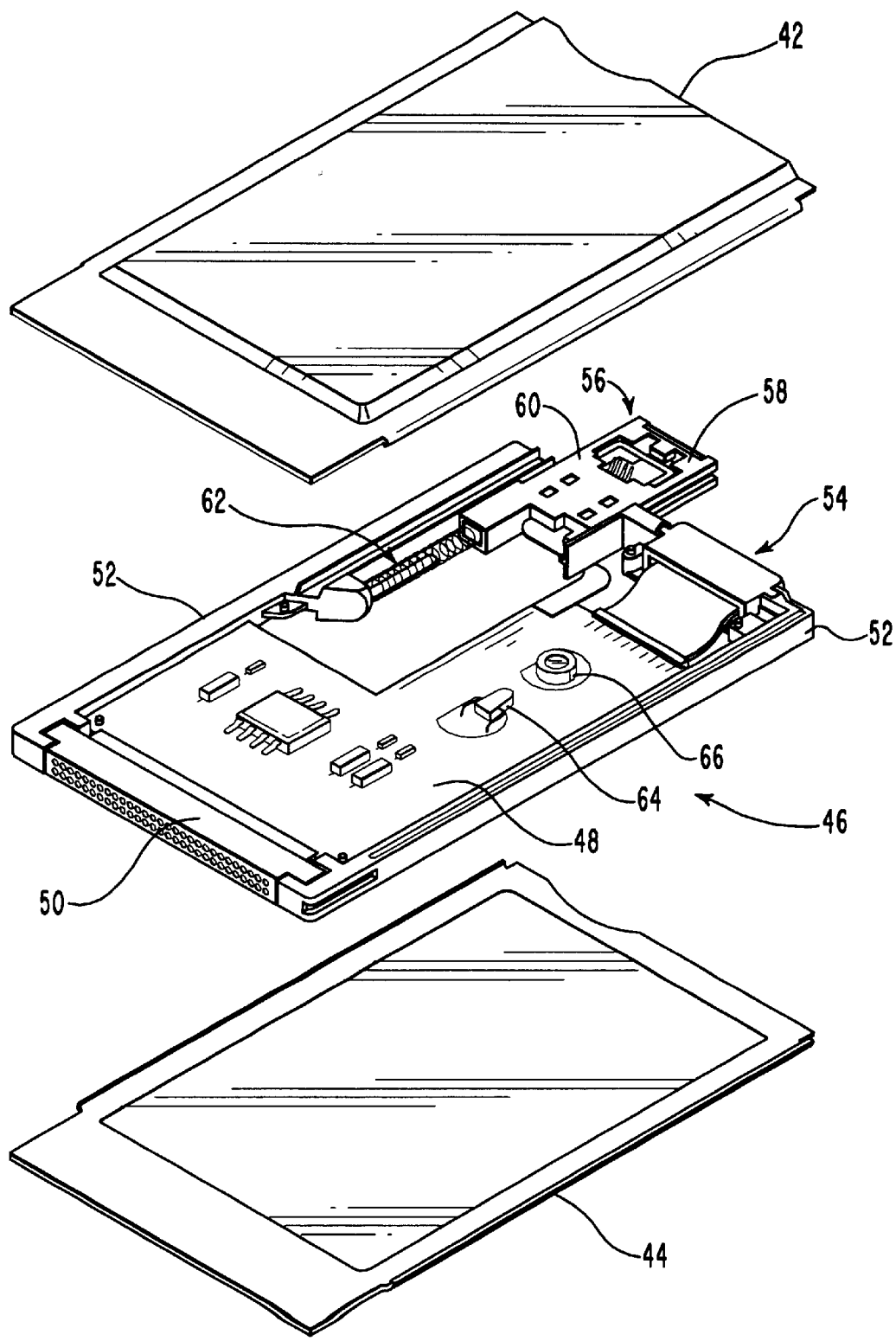
FIG. 4 is an exploded perspective view of a PCMCIA card incorporating another embodiment of the present invention wherein the infrared transmission and reception means operate through the upper jacket constructed of an infrared permeable material.

FIG. 4 is an exploded perspective drawing of another embodiment of the present invention as used in the notebook computer 20 of FIG. 1 incorporating the unique communication apparatus of the present invention and for implementing a speakerphone. The PCMCIA modem card comprises an upper jacket piece 42, a lower jacket piece 44, and an internal circuit assembly 46. The upper and lower jacket pieces, 42 and 44, respectively, encompass the internal circuit assembly to form the exterior confines of the card.

The internal circuitry assembly 46 is composed of a circuit board 48 populated with various components interconnected so as to provide modem functionality (or alternatively other functionality). Encircling the circuit board 48, is a supporting frame 52 and a host computer interface 50. The host computer interface 50 is electrically coupled to the circuitry on the circuit board 48 so as to provide an electrical connection to the host computer system, typically a notebook computer. In this example, the host computer interface 50 is configured according to the PCMCIA standard. Furthermore, an IO receptacle 54 and an RJ11 jack assembly 56 are electronically coupled to the circuit board 48.

The RJ11 jack assembly 56 is composed an RJ11 jack 58 fit within a RJ11 jack base 60 that is selectively extensible with respect to the supporting frame 52 by way of a spring mechanism assembly 62. This allows the RJ11 jack to be either extended away from the main body of the PCMCIA card or stored internal to the card. This is useful for allowing the jack to be internally stored when not in use so as to keep all aspects of the PCMCIA card within the external housing of the host computer environment.

Important to the present invention is a phototransistor 64 that is sensitive to infrared light and an infrared LED 66 that emits infrared light. A complementary infrared LED is found on the host computer system in line with the phototransistor 64 and a complementary phototransistor is found on the host system in line with infrared LED 66. Furthermore, the upper jacket piece 42 is made of a material that will allow infrared light signals to pass uninhibited. In this manner, signals can be transferred in a wireless manner between the circuitry found on circuit board 48 and the host computer system circuitry without passing through the host computer interface 50 to form a bi-directional wireless data communication channel.

One material used in this exemplary embodiment that allows infrared light to pass through the upper jacket piece 42 uninhibited, is LEXAN® resin available from the General Electric plastics division of the General Electric Company located at One Plastics Avenue, Pittsfield, Mass. 01201. As used in this embodiment, visible light transmission is inhibited, infrared light transmission is permitted, and the material has a physical "look" of being black.

Figure 5:
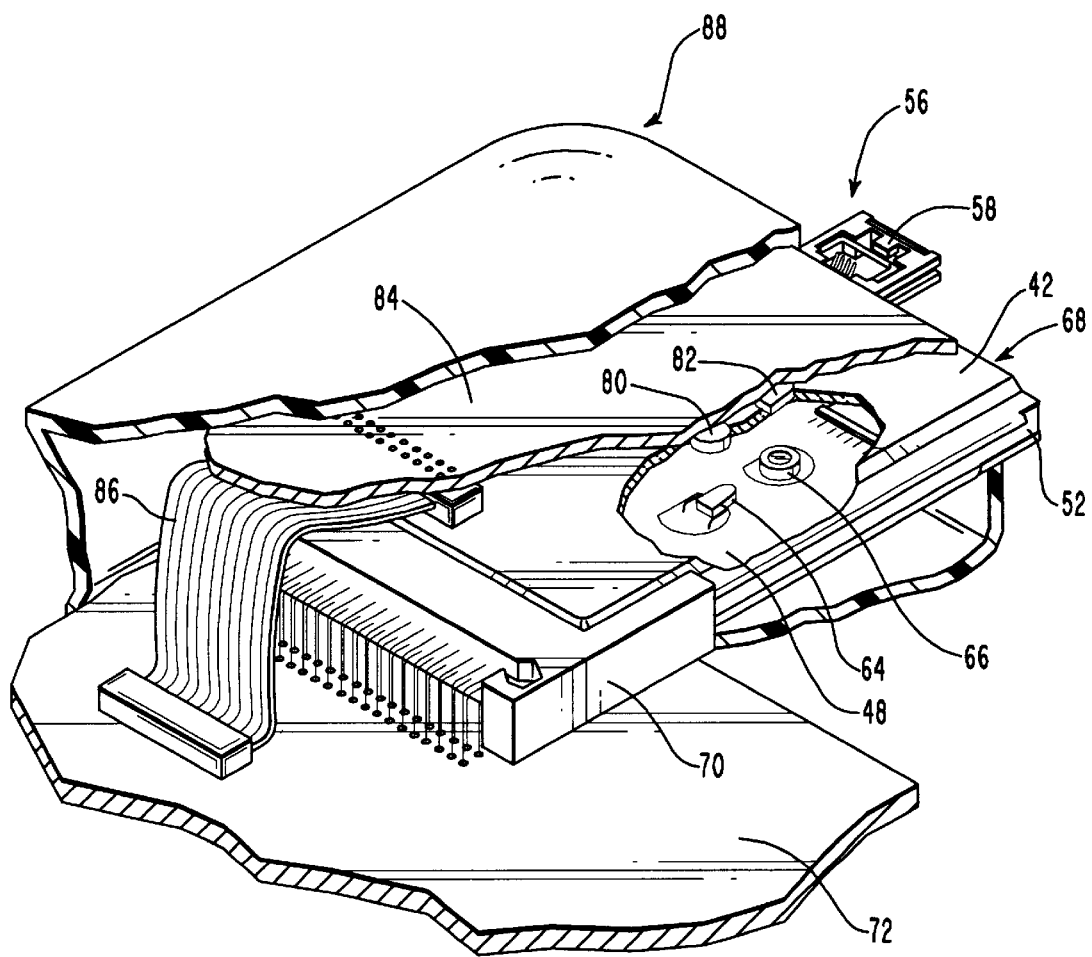
FIG. 5 is a cutaway perspective of a PCMCIA card of FIG. 4 while the card is inserted in its receptacle and showing communication between the card and the host computer.

FIG. 5 is a cutaway view of the PCMCIA card inserted in a notebook computer with the infrared LED and infrared sensitive phototransistor being completely within the confines of the external host computer housing for the embodiment shown in FIG. 4. A PCMCIA modem card 68 is inserted into a PCMCIA receptacle 70 that is electrically coupled to the host computer mother board 72. The PCMCIA modem card 68 also has a RJ11 jack assembly 56 shown in the extended position for interfacing with a phone network.

Once in the inserted position, the infrared sensitive phototransistor 76 and the infrared LED 78 are at a position completely within the external housing 68 of the host computer system.

Furthermore, an infrared LED 80 and infrared sensitive phototransistor 82 are connected to a base 84 and electronically connected to the host computer system circuit board 72 through connection means 86. Again, the infrared LED 80 and the infrared sensitive transistor 82 that are electrically connected to the host computer system circuit board 72 are again completely enclosed within the host computer system housing 88. Furthermore, when the PCMCIA modem card 68 is in the inserted position, the infrared LED 80 is linearly aligned with the infrared sensitive phototransistor 64 and the infrared sensitive phototransistor 82 is linearly aligned with the infrared LED 66 so as to allow signals to pass between the respective LED-photo-transistor pairs found on the PCMCIA modem card 68 and base 84 to allow bi-directional wireless signal transfer between the PCMCIA modem card 68 and the host computer circuit board 72.

Figure 6:
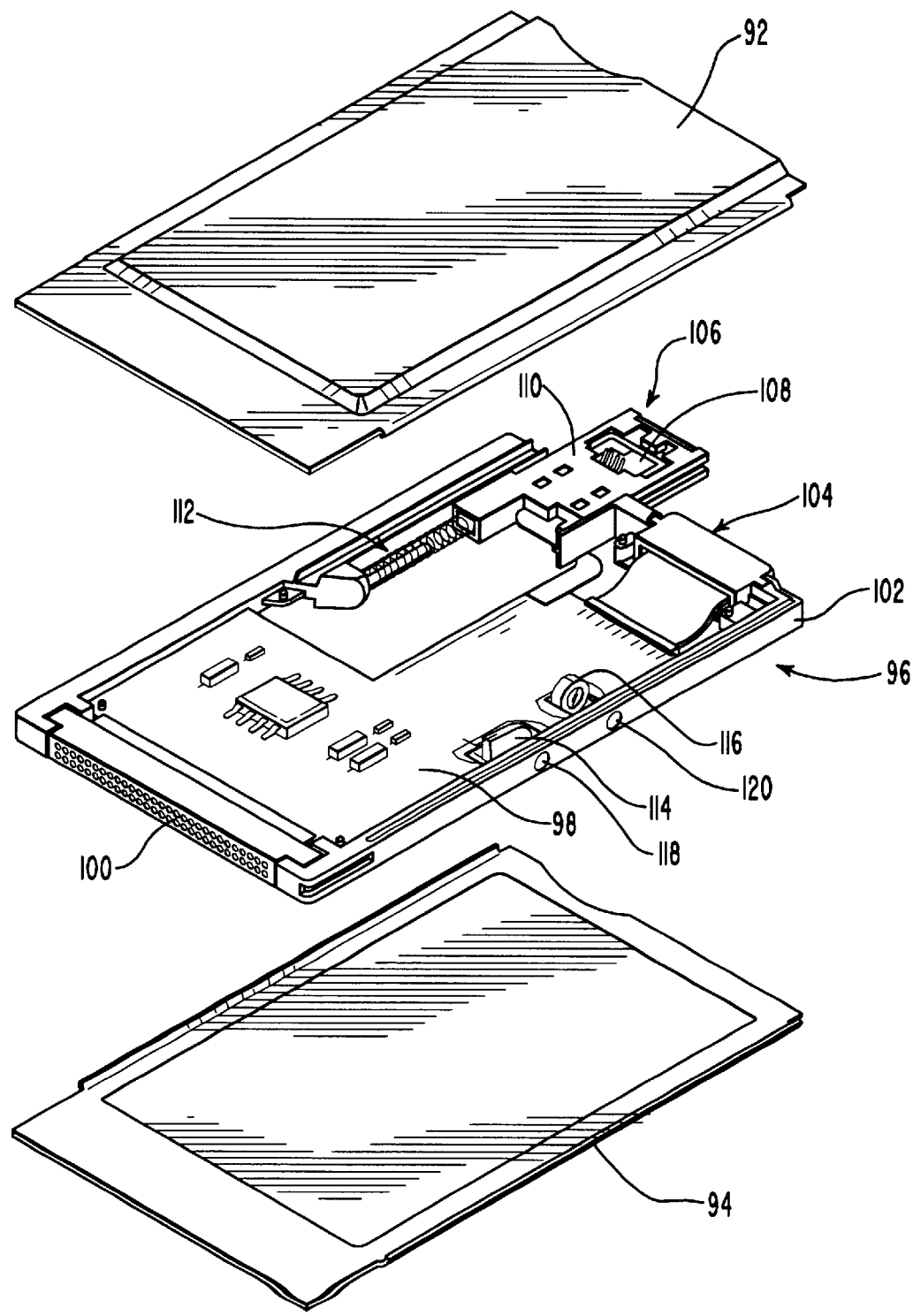
FIG. 6 is an exploded perspective of a PCMCIA card incorporating another embodiment of the present invention wherein the infrared transmission and reception means operate through orifices in the side of the PCMCIA chassis.

FIG. 6 shows another embodiment of a PCMCIA modem card with the infrared transmitting and receiving circuitry located along the PCMCIA card edge or side and the transmission occurs through holes bored in the side frame. FIG. 6 is an exploded perspective view of a PCMCIA modem card according to this alternative embodiment. An upper jack piece 92 and a lower jacket piece 94 encompass an internal circuitry assembly 96 in order to form the PCMCIA modem card. In this embodiment, the upper jacket piece 92 and the lower jacket piece are constructed of standard materials, typically metal.

The internal circuit assembly 96 has a circuit board 98 having componentry for a standard telecommunication modem. The circuit board 98 is electrically connected to a host computer interface 100 that will be used to connect the circuit board 98 with the host computer circuit board. Further, a supporting frame 102 holds the circuit board 98, as well as the host computer interface 100, a IO receptacle 104, and an RJ11 jack assembly 106.

The RJ11 jack assembly 106 has a RJ11 jack 108 formed within a RJ11 jack base 110 that is capable of being in a position inside of the assembled PCMCIA modem or in a position extending out from the PCMCIA modem to allow a mating RJ11 plug to be inserted into the RJ11 Jack 108. The spring mechanism assembly 112 allows RJ11 jack base 110 to easily and selectively extend and retract between a storage position with RJ11 jack 108 located within the PCMCIA modem card and an extended operational position.

Mounted on the circuit board 98 is an infrared sensitive phototransistor 114 and an infrared LED 116 The infrared sensitive phototransistor 114 and IR emitter 116 are oriented in a sideways position so that they may emit and receive infrared signals through orifices 118 and 120, respectively, located within the supporting frame 102. This will allow infrared signal transmission through the supporting frame and the corresponding card guide to mating infrared sensitive phototransistor and IR emitter electrically connected to the host computer system mother board.

Figure 7:
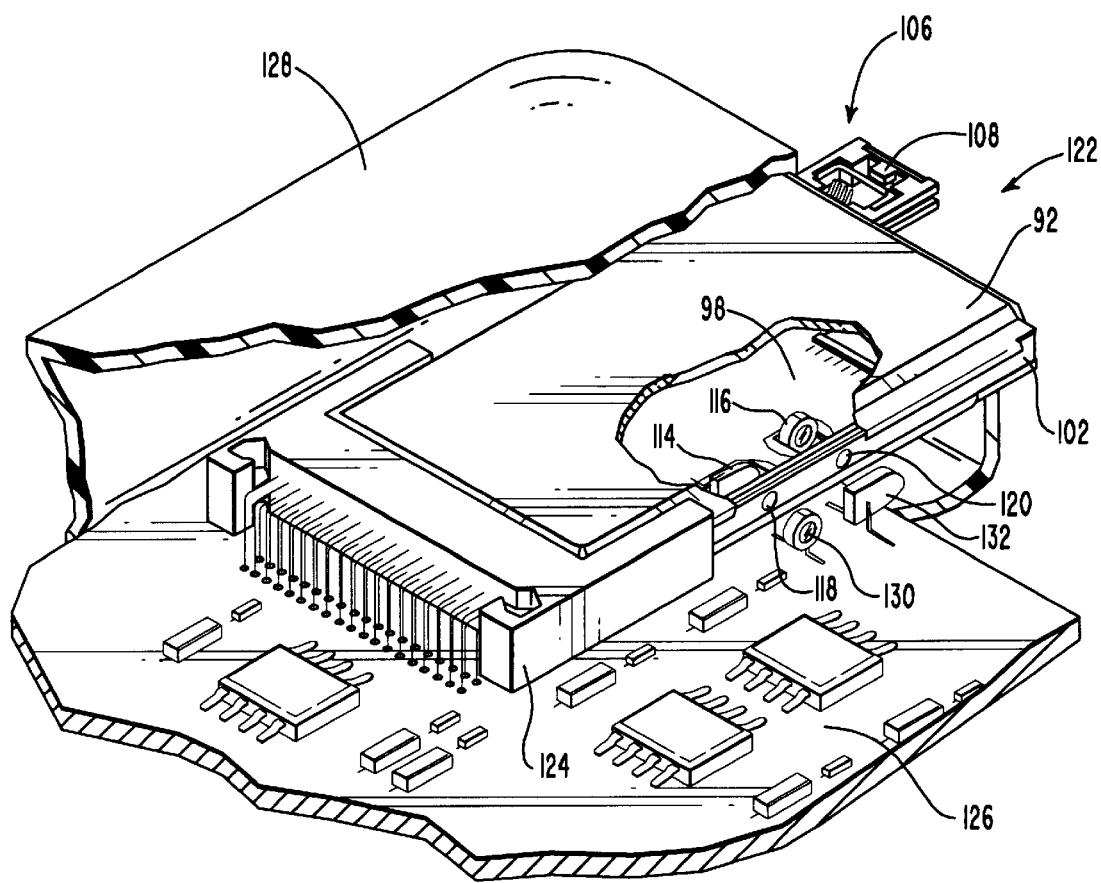
FIG. 7 is cutaway perspective of the PCMCIA card of FIG. 6 showing how the wireless signal transfer means operates through the chassis of the PCMCIA card to interact with corresponding wireless signal transfer means on the host computer within the host housing.

FIG. 7 is a cutaway perspective view of the PCMCIA modem card 122 of FIG. 6 as it appears when inserted into a PCMCIA receptacle of a host computer system such as a notebook system as shown in FIG. 1. The PCMCIA receptacle 124 is electrically connected to a host computer circuit board 126 that is populated with the host computer circuitry. Furthermore, it can be noted that the infrared sensitive phototransistor 114 and the infrared LED 116 located on the PCMCIA modem card 122 circuit board 98 are completely within the host housing 128. Also, on the host computer circuit board 126 is an infrared LED 130 and infrared sensitive phototransistor 132. These components allow the receipt and transmission of IR signals from the host computer circuit board 126 in another location.

Specifically, infrared LED 130 on host computer circuit board 126 is positioned so as to be linearly aligned with the infrared sensitive phototransistor 114 located on the modem circuit board 98 so that signals may be transmitted from the infrared LED 130 and received by the infrared sensitive phototransistor 114 thereby providing a communication path from the host computer circuit board 126 to the modem circuit board 98. To facilitate the transmission, orifice 118 allows the infrared signal to pass directly between the infrared LED 130 and the infrared sensitive phototransistor 114.

In like manner, the infrared sensitive phototransistor 132 located on the host computer circuit board 128 may receive infrared signals through orifice 120 from the infrared LED 116 located on the modem circuit board 98. In this manner, signals may travel from the modem circuit board 98 to the host computer circuit board 126. Together, the infrared LED 130 infrared sensitive phototransistor 114 pair and infrared LED 116 infrared sensitive 132 pair, respectively, form a bi-directional wireless data channel that wirelessly transferred signals between the host computer circuit board 126 and the modem circuit board 98.

Figure 8:
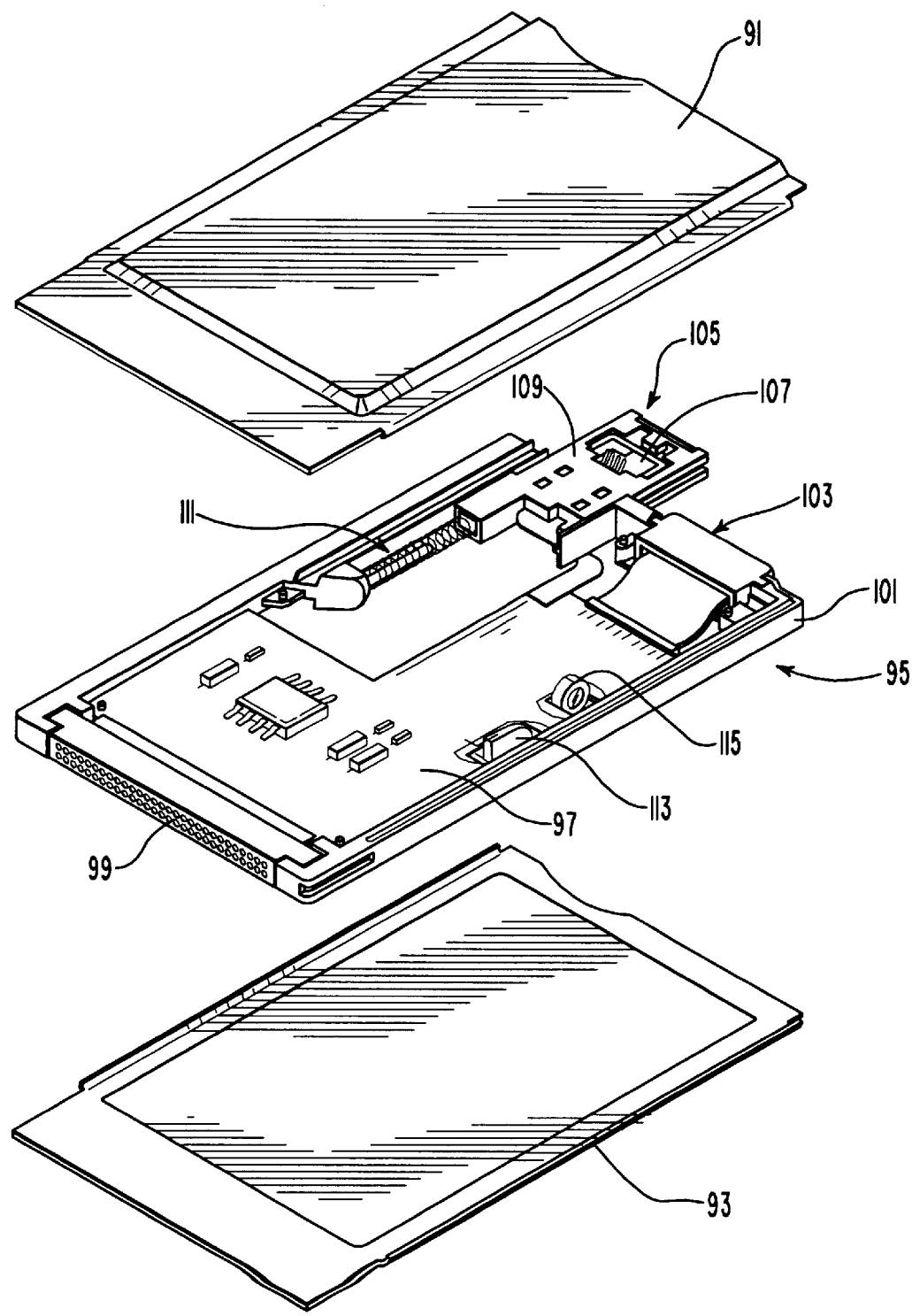
FIG. 8 is an exploded perspective of a PCMCIA card incorporating another embodiment of the present invention wherein the infrared transmission and reception means operate through the side of the PCMCIA chassis constructed of an infrared permeable material.

FIG. 8 shows another embodiment of a PCMCIA modem card with the infrared transmitting and receiving circuitry located along the side of the supporting frame with the signal transmitted through the supporting frame constructed infrared transparent material. FIG. 8 is an exploded perspective view of a PCMCIA modem card according to this alternative embodiment. An upper jack piece 91 and a lower jacket piece 93 encompass an internal circuitry assembly 95 in order to form the PCMCIA modem card. In this embodiment, the upper jacket piece 91 and the lower jacket piece 93 are constructed of standard materials, typically metal.

The internal circuit assembly 95 has a circuit board 97 having componentry for a standard telecommunication modem. The circuit board 97 is electrically connected to a host computer interface 99 that will be used to connect the circuit board 97 with the host computer circuit board. Further, a supporting frame 101 holds the circuit board 97, as well as the host computer interface 99, a IO receptacle 103, and an RJ11 jack assembly 105.

The RJ11 jack assembly 105 has a RJ11 jack 107 formed within a RJ11 jack base 109 that is capable of being in a position inside of the assembled PCMCIA modem or in a position extending out from the PCMCIA modem to allow a mating RJ11 plug to be inserted into the RJ11 jack 107. The spring mechanism assembly 111 allows RJ11 jack base 109 to easily and selectively extend and retract between a storage position with RJ11 jack 107 located within the PCMCIA modem card and an extended operational position.

Mounted on the circuit board 97 is an infrared sensitive phototransistor 113 and an infrared LED 115. The infrared sensitive phototransistor 113 and IR emitter 115 are oriented in a sideways position so that they may emit and receive infrared signals through the supporting frame 101 that is constructed of an infrared transparent material such as LEXAN®. This will allow infrared signal transmission through the supporting frame 101 and the corresponding card guide to mating infrared sensitive phototransistor and IR emitter electrically connected to the host computer system mother board.

Figure 9:
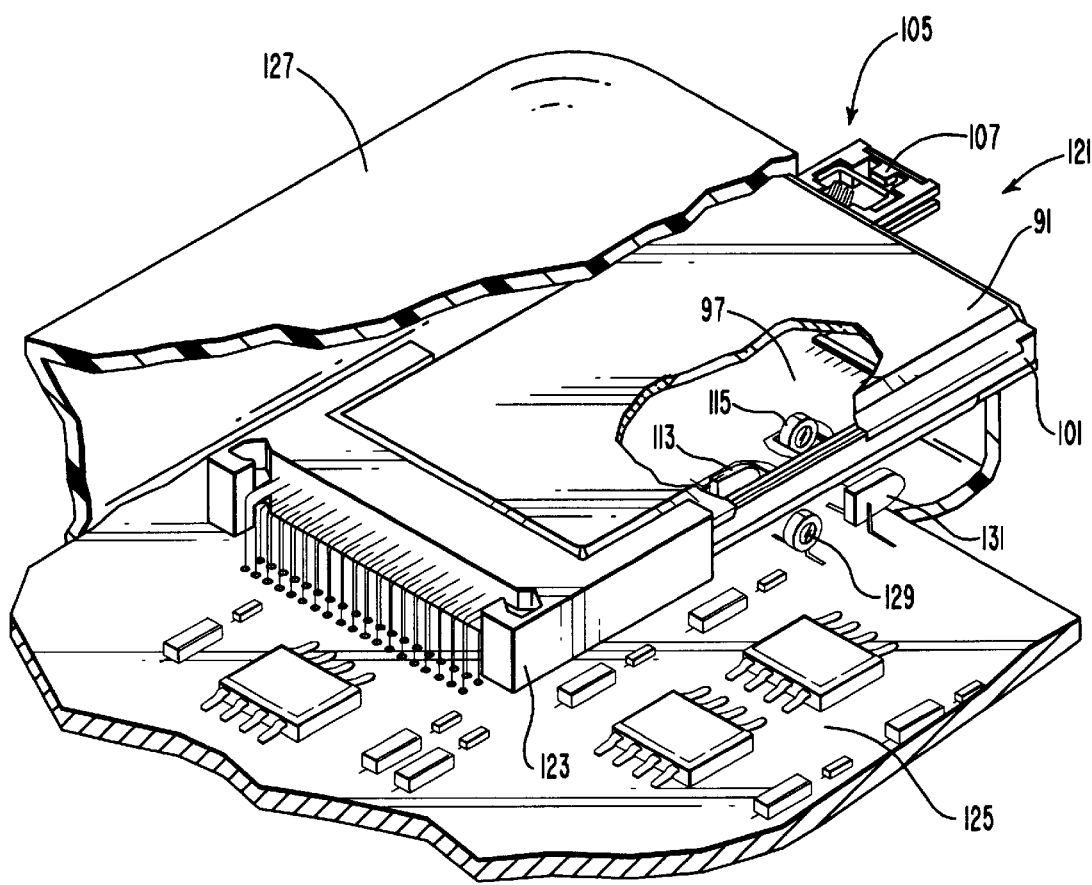
FIG. 9 is cutaway perspective of the PCMCIA card of FIG. 8 showing how the wireless signal transfer means operates through the side of the PCMCIA card to interact with corresponding wireless signal transfer means on the host computer within the host housing.

FIG. 9 is a cutaway perspective view of the PCMCIA modem card 121 of FIG. 8 as it appears when inserted into a PCMCIA receptacle of a host computer system such as a notebook system as shown in FIG. 1. The PCMCIA receptacle 123 is electrically connected to a host computer board 125 that is populated with the host computer circuitry. Furthermore, it can be noted that the infrared sensitive phototransistor 113 and the infrared LED 115 located on the PCMCIA modem card 121 circuit board 97 are completely within the host housing 127. Also, on the host computer circuit board 125 is an infrared LED 129 and infrared sensitive phototransistor 131. These components allow the receipt and transmission of IR signals from the host computer circuit board 125 in another location.

Specifically, infrared LED 129 on host computer circuit board 125 is positioned so as to be linearly aligned with the infrared sensitive phototransistor 113 located on the modem circuit board 97 so that signals may be transmitted from the infrared LED 129 and received by the infrared sensitive phototransistor 113 thereby providing a communication path from the host computer circuit board 125 to the modem circuit board 97. To facilitate the transmission, the supporting frame is constructed of a material that allows infrared signals to pass uninhibited.

In like manner, the infrared sensitive phototransistor 131 located on the host computer circuit board 127 may receive infrared signals through the transparent supporting frame 101 from the infrared LED 115 located on the modem circuit board 97. In this manner, signals may travel from the modem circuit board 97 to the host computer circuit board 125. Together, the infrared LED 129 infrared sensitive phototransistor 113 pair and infrared LED 115 infrared sensitive 131 pair, respectively, form a bi-directional wireless data channel that wirelessly transferred signals between the host computer circuit board 125 and the modem circuit board 97.

Figure 10:
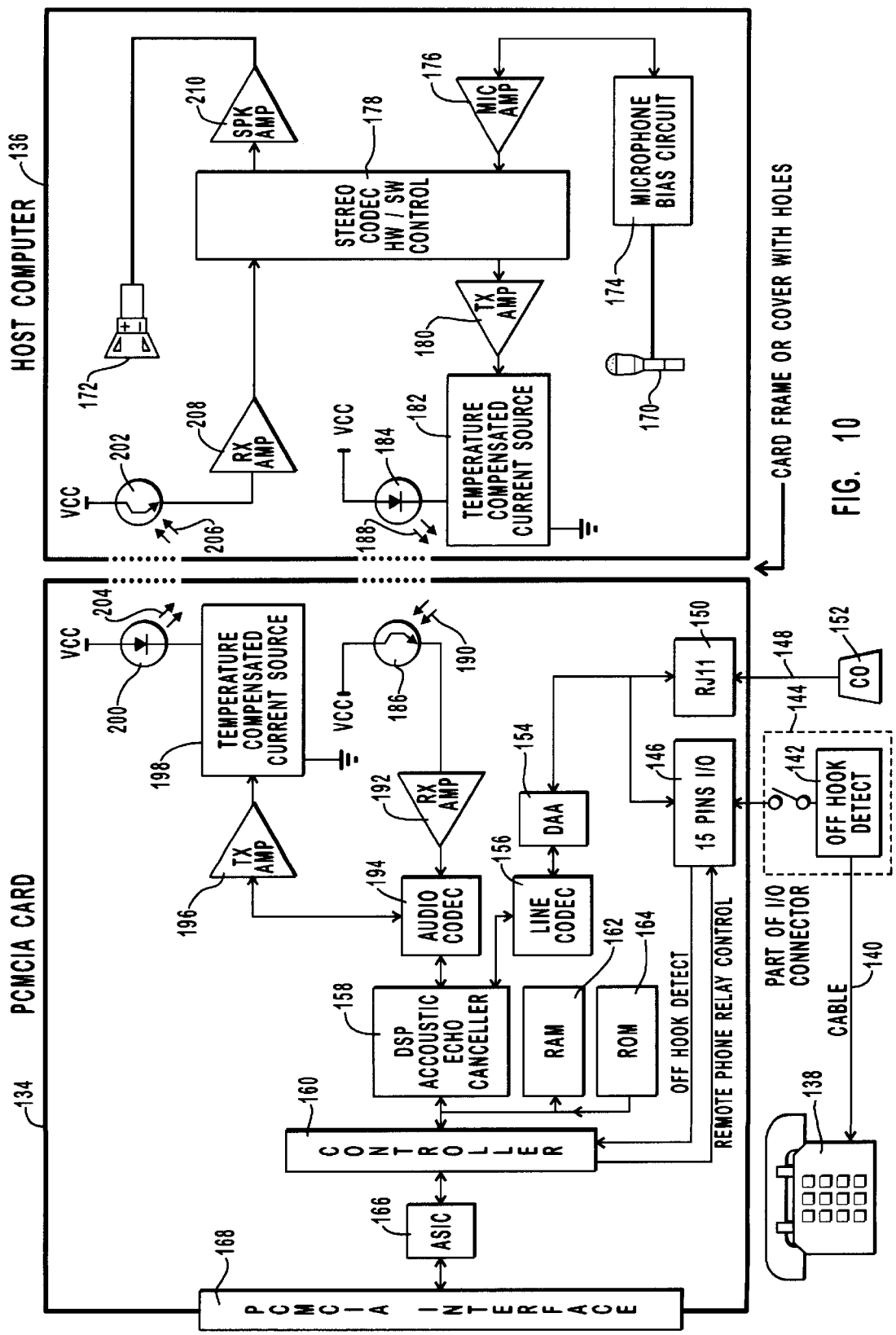
FIG. 10 is a block schematic diagram of a speakerphone application using a PCMCIA card in a host computer in communicating using wireless transmitters and receivers to communicate between the PCMCIA card and the host computer.

FIG. 10 is a schematic block diagram showing the componentry that can be added to a standard PCMCIA modem card and host computer system in order to implement a speakerphone. Besides modem componentry, the PCMCIA card will include the functional componentry included within the box 134. Likewise, the host computer will incorporate functionality enclosed within the box 136. A telephone 138 is hooked by a phone cable 140 to an off-hook detect circuit 142. The off-hook detect circuit 142 is part of a physical IO connector and cable represented by box 144 that will hook into a PCMCIA card through a pin IO receptacle 146 (shown in FIG. 1 as part of the IO connection 34). The off-hook detect hook circuit 142 will determine whether or not the telephone 138 is in use so that the speakerphone may be disabled when a user picks up the handset of telephone 138.

Furthermore, a phone cable 148 connects the PCMCIA card as represented by box 134 through RJ11 connection 150 to the phone network 152. Both the pins from the IO receptacle 146 and the RJ11 connection 150 are fed into a data access arrangement 154 for digital processing. This is accomplished through passing the signals from the data access arrangement 154 to a line CODEC 156 and onto a data signal processing echo canceler 158.

The data access arrangement (DAA) 154 is the circuitry necessary for accessing or transmitting an analog signal according to the requirements of communications network to which the PCMCIA card 134 is attached. This includes opto-isolators, transformers, and other mechanisms standard in the art allowing connection between systems having different electrical characteristics and requirements.

The line CODEC 156 digitizes the signal taken off of the phone line as received from the data access arrangement 154 by way of an analog-to-digital converter. This allows the signal data to be manipulated by echo cancellation circuit 158 or any other digital signal processing that may be required.

After digital signal processing, the digital signal will be converted to an analog signal by the audio CODEC 194 before being transmitted through a wireless communications channel to the host computer 136 as will be explained in more detail hereafter. It may be noted that the logical block diagram shows two separate CODECs, line CODEC 156 and audio CODEC 194, residing on the PCMCIA card 134. This is only illustrative of function and those skilled in the art will see that the same CODEC may perform the same function depending on physical implementation.

A microcontroller 160 controls the digital signal processing echo cancellation circuit 158 as well as provides an interface with the rest of the modem circuitry not shown in FIG. 10. Furthermore, to provide such interfacing behavior, the microcontroller 160 accesses RAM 162 and ROM 164 for programming and calculations as well as a custom ASIC 166 for interfacing through the PCMCIA interface 168 to electrically communicate with the host computer system.

Within the host computer 136 is a microphone 170 and a speaker 172 that are used as part of the speakerphone implementation. Signals from the speaker 170 will eventually reach the digital processing echo canceler 158 as controlled by microcontroller 160 and signals broadcast through the speaker 172 will be signals originating from the digital signaling processing echo canceler 158 as controlled by the microcontroller 160.

For voice signals received from microphone 170, an analog signal is received from a microphone biasing circuit 174 representing the voice signal that is amplified in amplifier 176 before running through stereo CODEC 178. The stereo CODEC 178 may be used to digitize the analog voice signal received from the microphone in order to store the information on the disk drive of the host computer system. This would be useful for an answering machine implemented as part of the system and other applications requiring the storage of voice data.

Furthermore, the stereo CODEC 178 can be controlled by host computer system software in order implement a gain control function for adjusting the volume of the signal as perceived through the speaker 172. In this manner, the stereo CODEC 178 could be making an analog-to-analog conversion of the signal implementing the desired signal gain affects.

Additionally, the stereo CODEC 178 allows signals from different sources to be mixed. For example, an answering machine implementation could allow the incoming analog signal transmitted from the PCMCIA card and the stored digital signal being heard by the caller to be mixed and simultaneously monitored through the speaker 172 on the host computer 136.

After processing in the stereo CODEC 178, the analog signal will be run through a transmission amplifier 180 and pass through a temperature compensated current source 182 before being transmitted from an infrared LED 184. The temperature compensated current source 182 is for assuring that proper signal levels are transmitted at the infrared LED 184 over temperature.

The infrared LED 184 sends an infrared signal (analog) across to an infrared sensitive transistor 186 as represented by transmit arrows 188 and receive arrows 190. In this way, microphone speech data is transmitted to the PCMCIA modem card for processing through a wireless data channel without burdening the PCMCIA interface. This is necessary in order to have enough information band width preserve high speech quality by sending an adequate amount of information for processing. The signal received by the infrared sensitive phototransistor 186 is amplified through a receiver amp 192 before being passed onto audio CODEC 194 for conversion from analog to digital format and processed through the digital system processing echo cancellation circuitry 158.

Signals to be transmitted on speaker 172 will originate from the phone or phone line, pass through line CODEC 156 for conversion to digital format, pass through the digital signal processing echo cancellation circuitry 158, pass through audio CODEC 194 for conversion back to analog format, and arrive at transmission amplifier 196 that prepares the signal for transmission from the PCMCIA modem card to the host computer. Again, the signal passes through a temperature compensated current source 198 in order to assure that a consistent transmit level will be found at the infrared LED 200 over temperature.

Transmission occurs between the infrared LED 200 found on the PCMCIA modem card and the infrared sensitive phototransistor 202 found on the host computer as shown by transmit arrows 204 and receive arrows 206. Again, this will occur in a linear orientation and will be facilitated by orifices in the PCMCIA modem card or some form of covering that will allow the infrared signal to transfer uninhibited.

While transmission is shown for an analog signal, some applications may transmit digital signals. Analog signal transmission has the advantage of typically being less costly to implement since the signal may be transmitted over a single infrared LED/phototransistor pair (or two pairs for full-duplex operation as shown). Digital transmission may require more infrared LED/phototransistor pairs due to the timing signals, bus widths, etc. associated with digital signals. The added hardware increases cost and may be prohibitive depending on the specific application. The present invention contemplates wireless transfer of signals as explained regardless of signal format.

Once the signal is received on the host computer, it passes through a receiver amplifier 208 to strengthen the signal before passing through the stereo CODEC 178 and on to the actual speaker amplifier 210 before being heard through speaker 172. Alternatively, the stereo CODEC 178 may digitize the analog signal received for storage at the host computer 136.

Figure 11:
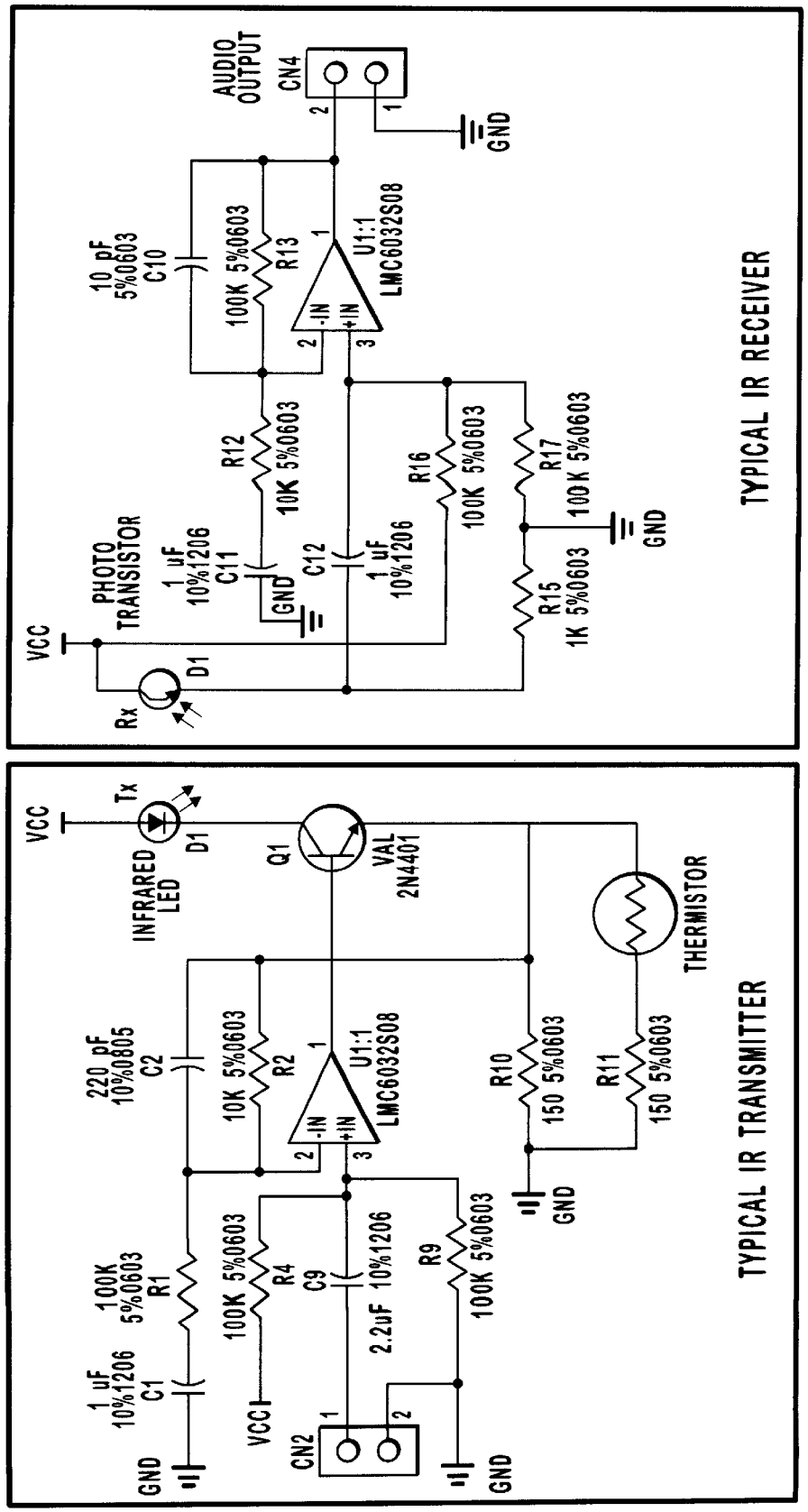
FIG. 11 is a schematic diagram showing sample implementations of a typical infrared transmitter and a typical infrared receiver.

It is important to note that the transmission and reception of the infrared signal occurs without any mechanical connection. The respective infrared transmitter (LED) and infrared receiver (infrared sensitive photo transistor) are simply placed in a physical orientation so that the transmission may occur uninhibited. Furthermore, any form of wireless transmission means may be used to accomplish the same data transmission channel. For example, a low strength radio signal could be transmitted and received between PCMCIA card and host computer to effectuate the same data transmission capabilities and again without burdening the electromechanical connection through the PCMCIA interface. FIG. 11 shows a typical IR transmitter and a typical IR receiver that can be implemented as part of the infrared transmission wireless signal transfer link as explained previously. Those skilled in the art will recognize how to use such a circuit and may incorporate other circuits of equivalent purpose but achieving the same transmission and reception and capabilities.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A peripheral device for use in a host system, wherein the host system includes host circuitry enclosed within a host housing, the peripheral device comprising:

a peripheral housing within which is disposed peripheral circuitry, the peripheral housing being sized and shaped so as to be capable of being physically received within a receptacle formed within the host housing;

an electrical connector coupled to the peripheral circuitry to transfer a first set of electrical signals between the host circuitry and the peripheral circuitry when the peripheral device is operatively received within the receptacle; and a wireless interface circuit disposed within the peripheral housing, the wireless interface circuit being capable of concurrently transferring a second set of electrical signals between the host circuitry and the peripheral circuitry via a wireless transmission channel when the peripheral device is operatively received within the receptacle.

2. A peripheral device as defined in claim 1, wherein the wireless transmission channel is bi-directional.

3. A peripheral device as defined in claim 1, wherein the peripheral housing, the electrical connector, and the receptacle each adhere to the PCMCIA standard.

4. A peripheral device as defined in claim 1, wherein the wireless transmission channel utilizes light as a transmission medium.

5. A peripheral device as defined in claim 1, wherein the wireless transmission channel utilizes electromagnetic waves as a transmission medium.

6. A peripheral device as defined in claim 1, wherein the wireless transmission channel utilizes audio signals as a transmission medium.

7. A peripheral device as defined in claim 1, wherein the interface circuit includes a transmitter capable of transmitting at least a portion of the second set of electrical signals for receipt by the host circuitry.

8. A peripheral device as defined in claim 1, wherein the interface circuit includes a receiver capable of receiving at least a portion of the second set of electrical signals wirelessly transmitted from the host circuitry.

\* \* \* \* \*